(12) United States Patent
de Gabory et al.

(10) Patent No.: US 7,978,737 B2
(45) Date of Patent: Jul. 12, 2011

(54) LASER DEVICE, CONTROL DEVICE OF LASER DEVICE, METHOD OF CONTROLLING LASER DEVICE, METHOD OF TUNING WAVELENGTH OF LASER DEVICE AND CONTROL DATA OF LASER DEVICE

(75) Inventors: Emmanuel le Taillandier de Gabory, Kanagawa (JP); Toshio Higashi, Yamanashi (JP); Yasuyuki Yamauchi, Yamanashi (JP); Hirokazu Tanaka, Yamanashi (JP); Junji Watanabe, Yamanashi (JP)

(73) Assignee: Eudyna Devices Inc., Nakakoma-gun, Yamanashi (JP)

( * ) Notice: Subject to any disclaimer, the term of this patent is extended or adjusted under 35 U.S.C. 154(b) by 226 days.

(21) Appl. No.: 11/832,840

(22) Filed: Aug. 2, 2007

(65) Prior Publication Data
US 2007/0280306 A1 Dec. 6, 2007

Related U.S. Application Data

(63) Continuation of application No. PCT/JP2006/301846, filed on Feb. 3, 2006.

(30) Foreign Application Priority Data

Feb. 3, 2005 (JP) ................................. 2005-028202

(51) Int. Cl.
*H01S 3/10* (2006.01)
(52) U.S. Cl. .......... 372/20; 372/29.016; 372/25; 372/92
(58) Field of Classification Search .................... 372/20, 372/25, 29.015, 92
See application file for complete search history.

(56) References Cited

U.S. PATENT DOCUMENTS

| | | | | |
|---|---|---|---|---|
| 5,130,998 A | * | 7/1992 | Wakata et al. | ................... 372/32 |
| 5,949,804 A | * | 9/1999 | Okazaki | ........................ 372/32 |
| 6,665,321 B1 | | 12/2003 | Sochava et al. | |
| 6,667,998 B1 | * | 12/2003 | Lo et al. | ........................ 372/34 |
| 7,120,178 B2 | * | 10/2006 | Kozlovsky et al. | ............. 372/36 |

(Continued)

FOREIGN PATENT DOCUMENTS
EP 1850431 A1 10/2007
(Continued)

OTHER PUBLICATIONS

M. Notomi et al.; "Broad-Band Tunable Two Section Laser Diode with External Grating Feedback"; IEEE Photonics Technology Letters, vol. 2, No. 2, Feb. 1990. pp. 85-87.

(Continued)

*Primary Examiner* — Minsun Harvey
*Assistant Examiner* — Delma R Forde
(74) *Attorney, Agent, or Firm* — Westerman, Hattori, Daniels & Adrian, LLP

(57) ABSTRACT

A laser device includes a cavity and a control portion. The cavity has an optical amplifier, a wavelength selectable portion having a changeable transmission wavelength range, and a mirror. The control portion controls the wavelength selectable portion so that the transmission wavelength range of the wavelength selectable portion is changed to a given range. The control portion controls the wavelength selectable portion so that the cavity outputs a desirable lasing wavelength light and optical intensity of the desirable lasing wavelength light is a given value, after controlling the wavelength selectable portion so that the cavity outputs the desirable lasing wavelength light.

4 Claims, 4 Drawing Sheets

U.S. PATENT DOCUMENTS

| | | | |
|---|---|---|---|
| 2002/0054614 A1* | 5/2002 | Jin | 372/20 |
| 2003/0016707 A1* | 1/2003 | McDonald et al. | 372/20 |
| 2005/0265402 A1* | 12/2005 | Tanaka et al. | 372/20 |
| 2006/0056465 A1* | 3/2006 | Xie et al. | 372/20 |

FOREIGN PATENT DOCUMENTS

| | | |
|---|---|---|
| JP | 4142090 A | 5/1992 |
| JP | 10190105 A | 7/1998 |
| JP | 2003283044 A | 10/2003 |
| WO | 03/005501 A2 | 1/2003 |

OTHER PUBLICATIONS

International Search Report of PCT/JP2006/301846, date of mailing Mar. 20, 2006.

Supplementary European Search Report dated Feb. 7, 2011, issued in corresponding European Patent Application No. 06712989.0.

* cited by examiner

FIG. 2A

| | SOA CONTROL CURRENT | PHASE SHIFTER CONTROL SIGNAL | LIQUID CRYSTAL ETALON PEAK CONTROL VOLTAGE | OPTICAL DETECTOR ELEMENT 33 TARGET CURRENT | OPTICAL DETECTOR ELEMENT 34 TARGET CURRENT | OPTICAL DETECTOR ELEMENT 35 TARGET CURRENT | THERMISTOR TEMPERATURE | TARGET VALUE 1 | TARGET VALUE 2 |
|---|---|---|---|---|---|---|---|---|---|
| CHANNEL 1 | $I_{SOA1}$ | $I_{PS1}$ | $V_{M1}$ | $I_{PD1-1}$ | $I_{PD2-1}$ | $I_{PD3-1}$ | $T_1$ | $P_1$ | $PH_1$ |
| CHANNEL 2 | $I_{SOA2}$ | $I_{PS2}$ | $V_{M2}$ | $I_{PD1-2}$ | $I_{PD2-2}$ | $I_{PD3-2}$ | $T_2$ | $P_2$ | $PH_2$ |
| ■■■ | ■■■ | ■■■ | ■■■ | ■■■ | ■■■ | ■■■ | ■■■ | ■■■ | ■■■ |
| CHANNEL n | $I_{SOAn}$ | $I_{PSn}$ | $V_{Mn}$ | $I_{PD1-n}$ | $I_{PD2-n}$ | $I_{PD3-n}$ | $T_n$ | $P_n$ | $PH_n$ |

FIG. 2B

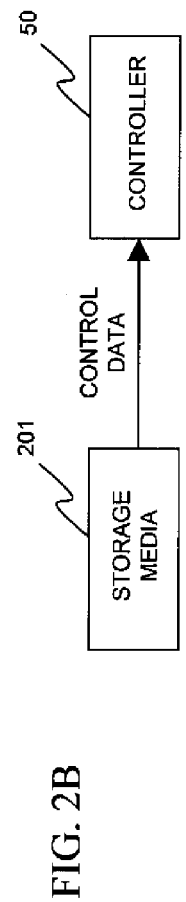

FIG. 2C

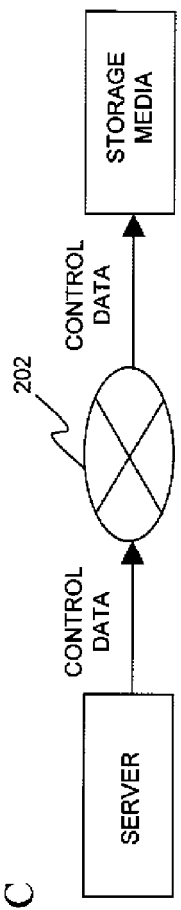

LASER DEVICE, CONTROL DEVICE OF LASER DEVICE, METHOD OF CONTROLLING LASER DEVICE, METHOD OF TUNING WAVELENGTH OF LASER DEVICE AND CONTROL DATA OF LASER DEVICE

BACKGROUND OF THE INVENTION

1. Field of the Invention

This invention generally relates to a laser device, a control device of a laser device, a method of controlling a laser device, a method of tuning a wavelength of a laser device and a control data of a laser device.

2. Description of the Related Art

Recently, an information-processing device and so on using a semiconductor laser have been developed. There is a demand for a high quality property such as tunability or stability of wavelength. And so, "Broad-Band Tunable Two-Section Laser Diode with External Grating Feedback" (IEEE PHOTONICS TECHNOLOGY LETTERS, VOL. 2, NO. 2, FEBRUARY 1990, PP. 85-87) discloses a wavelength tunable laser that has a wavelength-tuning portion controlling a transmission wavelength in an external cavity system. The wavelength tunable laser reflects a light of a given wavelength to a gain media (laser diode) by using a grating. The lasing wavelength is thus tunable.

However, it is necessary that the wavelength tunable laser controls the wavelength-tuning portion optimally, in order for a desirable lasing oscillation.

SUMMARY OF THE INVENTION

Various aspects of this invention have been made in view of the above-mentioned circumstances. The present invention provides a laser device, a control device of a laser device, a method of controlling a laser device, a method of tuning a wavelength of a laser device and a control data of a laser device that are capable of lasing at a desirable oscillation wavelength stably.

According to an aspect of the present invention, preferably, there is provided a laser device including a cavity and a control portion. The cavity has an optical amplifier, a wavelength selectable portion having a changeable transmission wavelength range, and mirrors. The control portion controls the wavelength selectable portion so that the transmission wavelength range of the wavelength selectable portion is changed to a given range. The control portion controls the wavelength selectable portion so that the cavity outputs a desirable lasing wavelength light and optical intensity of the desirable lasing wavelength light is a given value, after controlling the wavelength selectable portion so that the cavity outputs the desirable lasing wavelength light.

In the laser device in accordance with the present invention, a light in the transmission wavelength range of the wavelength selectable portion is resonating in the cavity. The wavelength selectable portion is controlled by the controller so that the cavity outputs the desirable wavelength light. After that, the transmission wavelength range of the wavelength selectable portion is controlled by the controller so that the cavity outputs the desirable wavelength light and the optical intensity of the desirable wavelength light is the given value. Therefore, it is possible to control the wavelength of the outputting light to be the desirable wavelength effectively. And it is possible to change the optical intensity of the outputting light. Accordingly, it is possible to output a desirable oscillation wavelength stably.

The wavelength selectable portion may be a first etalon having a changeable refractive-index against an incoming light according to an electrical signal provided thereto. In this case, it is possible to control the wavelength of the light resonating in the cavity by controlling the electrical signal to be provided to the first etalon.

The cavity may further have a second etalon having more than one transmission wavelength range at a given interval in the transmission wavelength range of the wavelength selectable portion. The desirable lasing wavelength may be included in one of the transmission wavelength ranges of the second etalon. In this case, a light is output in the wavelength range where the transmission wavelength range of the wavelength selectable portion and that of the second etalon are overlapped. Therefore, the laser device in accordance with the present invention is capable of selecting the desirable wavelength.

The laser device may include a third etalon and an optical detection portion. The third etalon may have more than one transmission wavelength range at a given interval. The optical detection portion may detect optical intensity of a light passing through the third etalon. A light emitted from the cavity may be fed into the third etalon. The control portion may control the wavelength selectable portion based on a detected result of the optical detection portion so that the cavity outputs a light of the desirable wavelength. In this case, a given corresponding relationship is generated between the wavelength of the outputting light from the cavity and optical intensity of the transmitting light through the third etalon. It is therefore possible to control the transmission wavelength range of the wavelength selectable portion based on the optical intensity detected by the optical detection portion.

According to another aspect of the present invention, preferably, there is provided a laser device including a cavity and a control portion. The cavity has an optical amplifier, a wavelength selectable portion having a changeable transmission wavelength range, and mirrors. The control portion controls the wavelength selectable portion so that the transmission wavelength range is changed to a given range. The control portion controls the wavelength selectable portion so that a lasing wavelength of the cavity is a peak wavelength of the transmission wavelength range or a wavelength positioned at longer wavelength side compared to the peak wavelength of the transmission wavelength range in the transmission wavelength range.

In the laser device in accordance with the present invention, a light in the transmission wavelength range of the wavelength selectable portion is resonating in the cavity. The wavelength selectable portion is controlled by the controller so that the cavity outputs the desirable wavelength light. The transmission wavelength range of the wavelength selectable portion is controlled by the controller so that the lasing wavelength of the cavity is the peak wavelength of the transmission wavelength range or the wavelength positioned at longer wavelength side compared to the peak wavelength of the transmission wavelength range in the transmission wavelength range. In this case, it is suppressed that an undesirable wavelength light at longer wavelength side compared to the peak wavelength is output, because the optical transmittance at longer wavelength side compared to the peak wavelength is reduced. In addition, it is suppressed that an undesirable wavelength light at shorter wavelength side compared to the peak wavelength is output, because the gain of the optical amplifier is reduced at shorter wavelength side compared to the lasing wavelength. The laser device in accordance with the present invention is therefore capable of outputting the desirable lasing wavelength light stably.

The control portion may control the wavelength selectable portion so that the cavity outputs a desirable lasing wavelength light and optical intensity of the desirable lasing wavelength light is a given value, after controlling the wavelength selectable portion so that the cavity outputs the desirable lasing wavelength light at the peak wavelength of the transmission wavelength range or in the range of longer wavelength side compared to the peak wavelength of the transmission wavelength range in the transmission wavelength range. In this case, the laser device in accordance with the present invention is capable of keeping the lasing wavelength the desirable one, and is capable of controlling the optical intensity of the outputting light to be the desirable one.

The wavelength selectable portion may be a first etalon having a changeable refractive-index against an incoming light according to an electrical signal provided thereto. In this case, it is possible to control the wavelength of the light resonating in the cavity by controlling the electrical signal to be provided to the first etalon.

The cavity may further have a second etalon having more than one transmission wavelength range at a given interval in the transmission wavelength range of the wavelength selectable portion. The desirable lasing wavelength may be included in one of the transmission wavelength ranges of the second etalon. In this case, a light is output in the wavelength range where the transmission wavelength range of the wavelength selectable portion and that of the second etalon are overlapped. Therefore, the laser device in accordance with the present invention is capable of selecting the desirable wavelength.

The laser device may include a third etalon and an optical detection portion. The third etalon may have more than one transmission wavelength range at a given interval. The optical detection portion may detect optical intensity of a light passing through the third etalon. A light emitted from the cavity may be fed into the third etalon. The control portion may control the wavelength selectable portion based on a detected result of the optical detection portion so that the cavity outputs a light of the desirable wavelength. In this case, a given corresponding relationship is generated between the wavelength of the outputting light from the cavity and optical intensity of the transmitting light through the third etalon. It is therefore possible to control the transmission wavelength range of the wavelength selectable portion based on the optical intensity detected by the optical detection portion.

According to another aspect of the present invention, preferably, there is provided a control device controlling a laser device that has a cavity in which a wavelength selectable portion having a changeable transmission wavelength range is arranged between an optical amplifier and mirrors. The control device controls the wavelength selectable portion so that optical intensity of a light emitted from the cavity is a given value at a peak wavelength of the transmission wavelength range or at a wavelength positioned at longer wavelength side compared to the peak wavelength of the transmission wavelength range in the transmission wavelength range. In this case, it is suppressed that an undesirable wavelength light at longer wavelength side compared to the peak wavelength is output, because the optical transmittance at longer wavelength side compared to the peak wavelength is reduced. In addition, it is suppressed that an undesirable wavelength light at shorter wavelength side compared to the peak wavelength is output, because the gain of the optical amplifier is reduced at shorter wavelength side compared to the lasing wavelength. Therefore, the control device in accordance with the present invention is capable of controlling the wavelength of the outputting light of the laser device to be the desirable one effectively, and is capable of changing the optical intensity of the outputting light of the laser device. Accordingly, it is possible to output a desirable emission laser stably.

The cavity may further have a phase shift portion adjusting a phase of a light resonating in the cavity. The control device may control the phase of the light resonating in the cavity with use of the phase shift portion. In this case, it is possible to adjust the wavelength of the light resonating in the cavity with use of the phase shift portion. It is therefore possible to select the desirable wavelength.

The laser device may further have a temperature control device controlling a temperature of the cavity. The control device may control the temperature of the cavity with use of the temperature control device. In this case, it is possible to keep the temperature of the cavity constant with use of the temperature control device. It is therefore possible to keep the wavelength of the resonating light of the cavity a given value.

The laser device may further have an output control portion that controls an outputting of a light emitted from the cavity. The wavelength selectable portion may have more than one transmission wavelength range. The control device may control the output control portion so that the outputting of the light from the cavity is stopped when the control device changes the transmission wavelength range of the wavelength selectable portion. In this case, the outputting of a light from the laser device in accordance with the present invention is stopped when the transmission wavelength range of the wavelength selectable portion is changed. It is possible to limit an output of an unstable light.

According to another aspect of the present invention, preferably, there is provided a method of controlling a laser device including a first step and a second step. The laser device has a cavity in which a wavelength selectable portion having a changeable transmission wavelength range is arranged between an optical amplifier and an external mirror. The first step is a step of controlling the wavelength selectable portion so that the lasing wavelength of the cavity corresponds to a peak wavelength of the transmission wavelength range, or is in a range of longer wavelength side compared to the peak wavelength of the transmission wavelength range in the transmission wavelength range. The second step is a step of controlling the wavelength selectable portion so that the cavity emits a desirable wavelength light and optical intensity of the desirable wavelength light is a given value at the peak wavelength of the transmission wavelength range or in the range of longer wavelength side compared to the peak wavelength of the transmission wavelength range in the transmission wavelength range, after the first step.

In the method in accordance with the present invention, the wavelength selectable portion is controlled so that the lasing wavelength of the cavity corresponds to a peak wavelength of the transmission wavelength range, or is in a range of longer wavelength side compared to the peak wavelength of the transmission wavelength range in the transmission wavelength range. And the transmission wavelength range of the wavelength selectable portion is changed so that the cavity outputs a desirable wavelength light and optical intensity of the desirable wavelength light is changed. In this case, it is suppressed that an undesirable wavelength light at longer wavelength side compared to the peak wavelength is output, because the optical transmittance at longer wavelength side compared to the peak wavelength is reduced. In addition, it is suppressed that an undesirable wavelength light at shorter wavelength side compared to the peak wavelength is output, because the gain of the optical amplifier is reduced at shorter wavelength side compared to the lasing wavelength. Therefore, the control device in accordance with the present invention is capable of controlling the wavelength of the outputting light of the laser device to be the desirable one effectively, and is capable of changing the optical intensity of the outputting light of the laser device. Accordingly, it is possible to output a desirable emission laser stably.

The laser device may further have an etalon having more than one transmission wavelength range at a given interval. The first step may be a step of controlling the cavity so as to output the desirable wavelength light, by setting the transmission wavelength range of the wavelength selectable portion so as to be overlapped with one of the transmission wavelength ranges of the etalon. In this case, a light in the wavelength range where the transmission wavelength range of the wavelength selectable portion and that of the second etalon are overlapped is output. Therefore, the laser device in accordance with the present invention is capable of selecting the desirable wavelength.

The laser device may further have a phase shift portion that adjusts a phase of a light resonating in the cavity. The first step may be a step of controlling the cavity so as to output the desirable wavelength light, by adjusting the phase of the light resonating in the cavity with use of the phase shift portion. In this case, it is possible to adjust the wavelength of the resonating light in the cavity with use of the phase shift portion. It is therefore possible to select the desirable wavelength.

The method may include a third step of changing output intensity of the optical amplifier so that the cavity outputs the desirable wavelength light and the optical intensity of the desirable wavelength light is a given value, after the second step. In this case, the laser device in accordance with the present invention is capable of outputting a light of desirable optical intensity.

According to another aspect of the present invention, preferably, there is provided a method of tuning a wavelength of a laser in accordance with the present invention including a first step through a fifth step. The laser device has a cavity in which a wavelength selectable portion having a changeable transmission wavelength range is arranged between an optical amplifier and an external mirror and has an output control portion controlling an outputting of a light from the cavity. The first step is a step of controlling the wavelength selectable portion so that a lasing wavelength of the cavity is in a first range that is in the transmission wavelength range and is positioned at longer wavelength side compared to a peak wavelength of the transmission wavelength range. The second step is a step of controlling the wavelength selectable portion so that the cavity outputs a desirable lasing wavelength light at the peak wavelength of the transmission wavelength range or in the range of longer wavelength side compared to the peak wavelength of the transmission wavelength range in the transmission wavelength range and optical intensity of the desirable lasing wavelength light is a given value after the first step. The third step is a step of controlling the output control portion so that the outputting of the light from the cavity is stopped. The fourth step is a step of controlling the wavelength selectable portion so that the lasing wavelength of the cavity is the peak wavelength of the transmission wavelength range or in the range of longer wavelength side compared to the peak wavelength of the second transmission wavelength range in the transmission wavelength range. The fifth step is a step of controlling the wavelength selectable portion so that the cavity outputs the desirable lasing wavelength light at a peak wavelength of the transmission wavelength range or in the range of longer wavelength side compared to the peak wavelength of the transmission wavelength range in the transmission wavelength range and the optical intensity of the desirable lasing wavelength light is a given value after the fourth step.

In the method of tuning a wavelength of a laser in accordance with the present invention, the wavelength selectable portion is controlled so that a lasing wavelength of the cavity is in a first range that is in the transmission wavelength range and is positioned at longer wavelength side compared to a peak wavelength of the transmission wavelength range. After that, the wavelength selectable portion is controlled so that the cavity outputs a desirable lasing wavelength light at the peak wavelength of the transmission wavelength range or in the range of longer wavelength side compared to the peak wavelength of the transmission wavelength range in the transmission wavelength range and optical intensity of the desirable lasing wavelength light is a given value. The output control portion is controlled so that the outputting of the light from the cavity is stopped. The wavelength selectable portion is controlled so that the lasing wavelength of the cavity is the peak wavelength of the transmission wavelength range or in a second range of longer wavelength side compared to the peak wavelength of the transmission wavelength range in the transmission wavelength range. After that, the wavelength selectable portion is controlled so that the cavity outputs the desirable lasing wavelength light at the peak wavelength of the transmission wavelength range or in the range of the longer wavelength side compared to the peak wavelength of the transmission wavelength range in the transmission wavelength range and the optical intensity of the desirable lasing wavelength light is a given value. In this case, the outputting of a light from the laser device in accordance with the present invention is stopped when the transmission wavelength range of the wavelength selectable portion is changed. It is therefore possible to limit outputting of an unstable light. It is possible to control the wavelength of the outputting light of the laser device to be the desirable one effectively, and is possible to change the optical intensity of the outputting light of the laser device. Accordingly, it is possible to output a desirable emission laser stably.

The laser device may further have an etalon having more than one transmission wavelength range at a given interval. The first step may be a step of controlling the cavity so as to output the desirable wavelength light, by setting the transmission wavelength range of the wavelength selectable portion so as to be overlapped with one of the transmission wavelength ranges of the etalon. In this case, a light is output in the wavelength range where the transmission wavelength range of the wavelength selectable portion and that of the second etalon are overlapped. Therefore, the laser device in accordance with the present invention is capable of selecting the desirable wavelength.

The laser device may further have a phase shift portion that adjusts a phase of a light resonating in the cavity. The first step may be a step of controlling the cavity so as to output the desirable wavelength light, by adjusting the phase of the light resonating in the cavity with use of the phase shift portion. In this case, it is possible to adjust the wavelength of the resonating light in the cavity with use of the phase shift portion. It is possible to select the desirable wavelength.

The method may include a step of changing output intensity of the optical amplifier so that the cavity outputs the desirable wavelength light and the optical intensity of the desirable wavelength light is a given value, after the third step. In this case, the laser device in accordance with the present invention is capable of outputting a light of a desirable optical intensity.

According to another aspect of the present invention, preferably, there is provided a control data of a laser device including a first control data and a first target value. The first control data is with which a controller controls a wavelength selectable portion so that the laser device outputs a desirable lasing wavelength light. The laser device has a cavity having a structure in which the wavelength selectable portion having a changeable transmission wavelength range is arranged between an optical amplifier and an external mirror and having the controller controlling the transmission wavelength range of the wavelength selectable portion. The first target value is with which the controller controls the wavelength selectable portion so that the cavity outputs the desirable lasing wavelength light and optical intensity of the desirable lasing wavelength light is a given value after the laser device outputs the desirable lasing wavelength light.

In the laser device in accordance with the present invention, a light in the transmission wavelength range of the wavelength selectable portion is resonating in the cavity. The wavelength selectable portion is controlled based on the first control data by the controller so that the cavity outputs the desirable lasing wavelength light. After that, the transmission wavelength range of the wavelength selectable portion is controlled based on the first target value by the controller so that the cavity outputs the desirable lasing wavelength light and optical intensity of the desirable lasing wavelength light is changed. Therefore, it is possible to control the wavelength of the outputting light to be the desirable value effectively. And it is possible to change the optical intensity of the outputting light. Accordingly, it is possible to output a desirable emission laser stably.

The wavelength selectable portion may have more than one transmission wavelength range. The first control data and the first target value may include values at every transmission wavelength range of the wavelength selectable portion. In this case, it is possible to adjust the wavelength of the outputting light at every transmission wavelength range of the wavelength selectable portion. And it is possible to change the optical intensity of the outputting light.

The control data may include a second control data. The laser device may further have a temperature control device keeping a temperature of the laser device a given value. The controller may control the temperature of the temperature control device with the second control data. In this case, the temperature of the laser device is controlled so as to be a given value by the temperature control device based on the second data.

The control data may include a second target value. The laser device may further have a phase shift portion adjusting a phase of a light resonating in the cavity. The controller may control the phase shift portion with the second target value. In this case, it is possible to adjust the wavelength of the resonating light when the phase of the resonating light is adjusted by the phase shift portion based on the second target value. And an accuracy of selecting a wavelength of the outputting light is improved.

BRIEF DESCRIPTION OF THE DRAWINGS

Preferred embodiments of the present invention will be described in detail with reference to the following drawings, wherein:

FIG. 2A through FIG. 2C illustrate a control data of the laser device;

DESCRIPTION OF THE PREFERRED EMBODIMENTS

A description will now be given of the best mode for carrying out the invention.

First Embodiment

Figure 1:
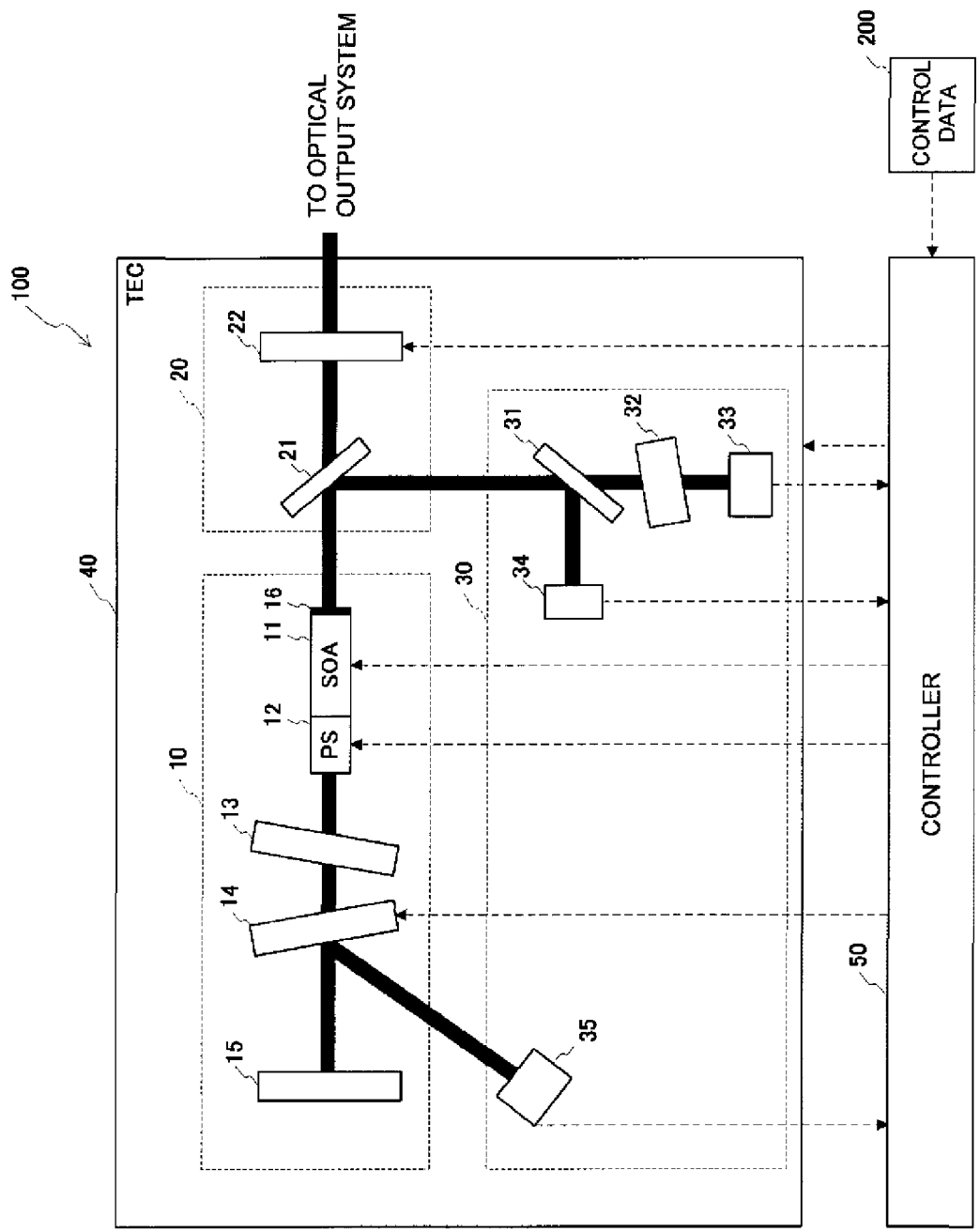
FIG. 1 illustrates a schematic view of a whole structure of a laser device in accordance with a first embodiment.

FIG. 1 illustrates a schematic view of an overall structure of a laser device 100 in accordance with a first embodiment. As shown in FIG. 1, the laser device 100 has an external cavity portion 10, an output portion 20, a wavelength monitor 30, a temperature control device 40 and a controller 50.

The external cavity portion 10 has a semiconductor optical amplifier 11, a phase shifter 12, a fixed etalon 13, a liquid crystal etalon 14 and an external mirror 15. The phase shifter 12 is secured to a back face of the semiconductor optical amplifier 11. The fixed etalon 13, the liquid crystal etalon 14 and the external mirror 15 are arranged backward of the semiconductor optical amplifier 11 and the phase shifter 12 in order.

The semiconductor optical amplifier 11 receives an instruction from the controller 50. And the semiconductor optical amplifier 11 amplifies an incoming light having a given effective wavelength range, and outputs a laser light. A mirror 16 is provided in front of the semiconductor optical amplifier 11. A refractive-index of the phase shifter 12 changes according to an electrical signal provided from the controller 50. A phase of longitudinal modes of the external cavity portion 10 changes when the refractive-index of the phase shifter 12 changes. A light passing through the phase shifter 12 is fed into the fixed etalon 13.

The fixed etalon 13 is composed of band-pass filters transmitting a light at a given wavelength interval. And a light fed into the fixed etalon 13 is emitted from the fixed etalon 13 to the liquid crystal etalon 14 as a light having wavelength peaks. The fixed etalon 13 is arranged being inclined to a light from the semiconductor optical amplifier 11. In the embodiment, the fixed etalon 13 has etalon peaks of more than 88-channel. Hereinafter, a peak of a transmission wavelength of an etalon is referred to as an etalon peak. Here, the fixed etalon is an etalon having a fixed refractive-index with an incoming light.

The liquid crystal etalon 14 is composed of a liquid crystal band-pass filter transmitting a light at a given wavelength interval. A refractive-index of the liquid crystal etalon 14 changes according to a voltage applied by the controller 50. A phase of etalon peaks of the liquid crystal etalon 14 changes when the refractive-index of the liquid crystal etalon 14 changes. The liquid crystal etalon 14 is arranged being inclined to the light from the semiconductor optical amplifier 11. The external mirror 15 reflects a light passing through the liquid crystal etalon 14. The external mirror 15 may be a mirror reflecting a part of an incoming light or a mirror reflecting all of the incoming light.

A light amplified by the semiconductor optical amplifier 11 is reflected by the mirror 16 of the semiconductor optical amplifier 11. The light passes through the phase shifter 12, the fixed etalon 13 and the liquid crystal etalon 14, and is fed into the external mirror 15. The light fed into the external mirror 15 is reflected by the external mirror 15, passes through the liquid crystal etalon 14, the fixed etalon 13 and the phase shifter 12, and is reflected by the mirror 16 of the semiconductor optical amplifier 11. The light amplified by the semiconductor optical amplifier 11 resonates between the external mirror 15 and the mirror 16, and is output to outside of the external cavity portion 10.

The output portion 20 has a beam splitter 21 and a shutter 22. The beam splitter 21 transmits a part of a light from the external cavity portion 10, and inputs the transmitting light to the shutter 22. The beam splitter 21 reflects a part of the light from the external cavity portion 10, and inputs the reflected light to the wavelength monitor 30. The shutter 22 receives an instruction from the controller 50, and controls outputting of a light from the beam splitter 21. It is therefore possible to stop outputting an unstable light when a wavelength, an output power, a phase and so on of the laser device 100 are adjusted.

The wavelength monitor 30 has a beam splitter 31, a locking etalon 32 and optical detector elements 33, 34 and 35. The beam splitter 31 transmits a part of a light from the beam splitter 21 and inputs the transmitting light to the locking etalon 32. The beam splitter 31 reflects a part of the light from the beam splitter 21 and inputs the reflected light to the optical detector element 34. The light fed into the locking etalon 32 is fed into the optical detector element 33 as a light having a wavelength peaks at a given interval.

The optical detector element 33 measures optical intensity of a light from the locking etalon 32, and inputs a measured value to the controller 50. The optical detector element 34 measures optical intensity of the light from the beam splitter 31, and inputs a measured value to the controller 50. A part of the light reflected by the external mirror 15 is reflected by the liquid crystal etalon 14, because the liquid crystal etalon 14 is inclined to the light from the semiconductor optical amplifier 11. The optical detector element 35 is arranged on a light path of the light reflected by the liquid crystal etalon 14. The optical detector element 35 measures optical intensity of the light reflected by the liquid crystal etalon 14, and inputs a measured value to the controller 50.

The external cavity portion 10, the output portion 20 and the wavelength monitor 30 are arranged on the temperature control device 40. The temperature control device 40 receives an instruction from the controller 50, and maintains a constant temperature. Therefore, the temperatures of the external cavity portion 10, the output portion 20 and the wavelength monitor 30 are maintained constant and the wavelength of the laser light from the laser device 100 is stabilized. The temperature control device 40 has a temperature sensor (not shown in FIG. 1). The temperature sensor inputs the temperature of the temperature control device 40 to the controller 50. It is possible to control the etalon peaks of the liquid crystal etalon 14 and the locking etalon 32 by controlling the temperature of the temperature control device 40.

The controller 50 has a central processing unit (CPU), a read only memory (ROM) and so on. The ROM of the controller 50 stores a control data 200 of the laser device 100. The controller 50 controls the semiconductor optical amplifier 11, the phase shifter 12, the liquid crystal etalon 14, the optical detector elements 33, 34 and 35, the shutter 22 and the temperature control device 40, according to the control data 200.

Next, a description will be given of the control data 200 of the laser device 100. FIG. 2A through FIG. 2C illustrate the control data 200 of the laser device 100. FIG. 2A illustrates a table of the control data 200. FIG. 2B illustrates a storage media storing the control data 200. FIG. 2C illustrates an aspect in which the control data 200 is transmitted to a user.

As shown in FIG. 2A, the control data 200 includes an initial data 200a and a target data 200b. The initial data 200a includes control currents of the semiconductor optical amplifier 11, electrical signals of the phase shifter 12, control voltages of the liquid crystal etalon 14, target currents of the optical detector elements 33, 34 and 35, and temperatures of the temperature control device 40 in a case where the temperature of the temperature control device 40 is a given value. The target data 200b has target values 1 and target values 2. Each of the voltages, the currents, and the target values 1 and 2 is generated at every channel of the fixed etalon 13. The target values 1 include target optical intensities of output of the laser device 100. The target values 2 include target wavelengths of an outputting light of the laser device 100.

The initial data 200a is used when the controller 50 in FIG. 1 initializes the semiconductor optical amplifier 11, the phase shifter 12 and the liquid crystal etalon 14. It is possible to initialize the outputting light of the laser device 100 according to the control data 200 generated in advance. The target values 1 and 2 of the target data 200b are used, when the controller 50 controls optical intensity and a phase of the outputting light of the laser device 100 after the initialization of the outputting light of the laser device 100.

Next, a description will be given of a method of generating the control data 200. The temperature control device 40 is controlled by the controller 50 so that the temperature control device 40 has a given temperature. Next, the external cavity portion 10 and the wavelength monitor 30 are controlled by the controller 50 so that a peak wavelength and optical intensity of a laser light emitted from the beam splitter 21 has a given value. The ROM of the controller 50 stores the control current of the semiconductor optical amplifier 11, the control electrical signal of the phase shifter 12, the control voltage of the liquid crystal etalon 14, the target currents of the optical detector elements 33, 34 and 35, and a detected result of the thermistor of the temperature control device 40 in this case. In addition, the ROM of the controller 50 stores the target optical intensity and the target wavelength of the outputting light of the laser device 100. The series of operations are operated with every channel of the fixed etalon 13. The control data 200 is generated through the operation mentioned above.

As shown in FIG. 2B, the control data 200 is stored in a storage media 201. A portable media such as a semiconductor memory, a magnetic disk or a CD-ROM is used as the storage media 201. The controller 50 uses the control data 200 stored in the storage media 201 and controls the wavelength of the laser light emitted from the laser device 100. As shown in FIG. 2C, the control data 200 is stored in a storage media prepared by the user in advance through an electrical transmitting means such as an Internet 202.

Figure 3A:
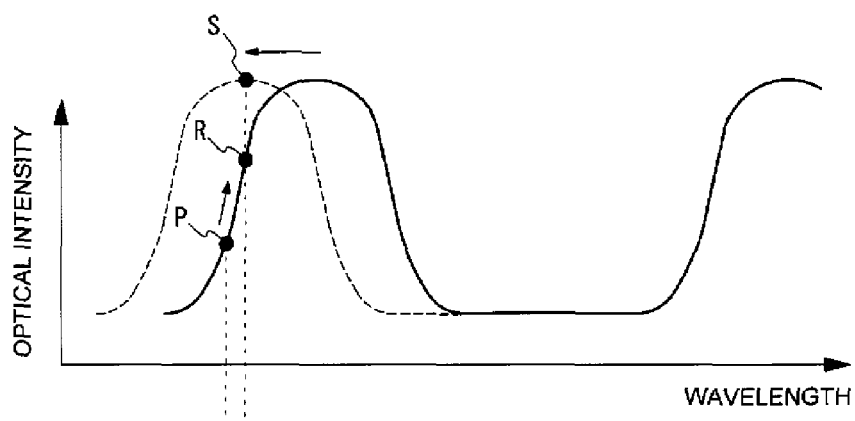
FIG. 3A through FIG. 3C illustrate the method of controlling the laser device.
Figure 3B:
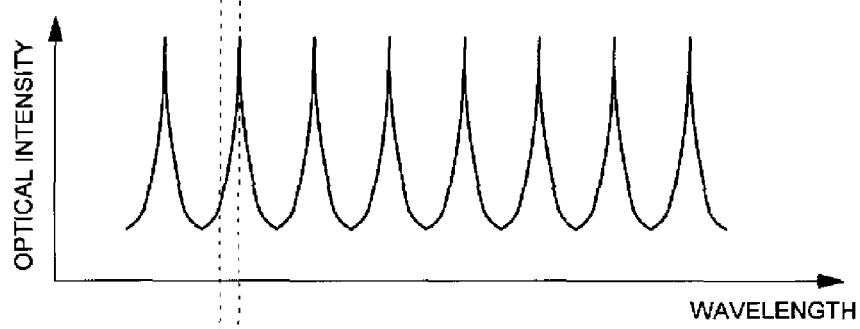
Figure 3C:
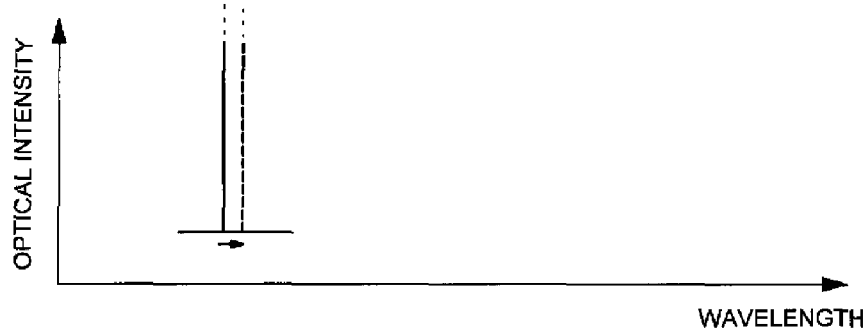

Next, a description will be given of a method of controlling the laser device 100. FIG. 3A through FIG. 3C illustrate the method of controlling the laser device 100. FIG. 3A illustrates an etalon peak bandwidth of the liquid crystal etalon 14. FIG. 3B illustrates an etalon peak bandwidth of the fixed etalon 13. FIG. 3C illustrates a longitudinal mode of the external cavity portion 10. The horizontal axes of FIG. 3A through FIG. 3C indicate a wavelength. The vertical axes of FIG. 3A through FIG. 3C indicate optical intensity of a transmitting light. Here, the etalon peak bandwidth is referred to a wavelength bandwidth including an etalon peak and having a relatively high optical transparency.

A solid line of FIG. 3A indicates an etalon peak bandwidth of the liquid crystal etalon 14 based on the initial data 200a. A solid line of FIG. 3C indicates a longitudinal mode of the external cavity portion 10 generated based on the initial data 200a. The optical intensity of a light resonating in the external cavity portion 10 shown in FIG. 1 is that of a combined peak of the etalon peak bandwidth of the liquid crystal etalon 14, the etalon peak bandwidth of the fixed etalon 13 and the longitudinal mode of the external cavity portion 10.

The controller 50 controls the voltage applied on the liquid crystal etalon 14, the electrical signal provided to the phase shifter 12 and the electrical signal provided to the semiconductor optical amplifier 11 with use of the initial data 200a of the control data 200. In the embodiment, a desirable etalon peak of the fixed etalon 13 and a desirable longitudinal mode of the external cavity portion 10 are positioned at shorter wavelength side compared to the etalon peak of the liquid crystal etalon 14 in a wavelength bandwidth where the etalon peak bandwidth of the liquid crystal etalon 14, the etalon peak bandwidth of the fixed etalon 13 and the longitudinal mode of the external cavity portion 10 are overlapped. In this case, the optical intensity of the light resonating in the external cavity portion 10 is a value shown in point P in FIG. 3A.

Next, the controller 50 controls the longitudinal mode of the external cavity portion 10 so that the longitudinal mode of the external cavity portion 10 corresponds to the etalon peak of the fixed etalon 13. In this case, the controller 50 controls the longitudinal mode of the external cavity portion 10 so that the optical intensity of the transmitting light through the fixed etalon 13 is increased. It is possible to control the longitudinal mode of the external cavity portion 10 by controlling the electrical signal to be provided to the phase shifter 12 with use of the detected results of the optical detector elements 33 and 34. In this case, the optical intensity of the light resonating in the external cavity portion 10 is a value shown in point R in FIG. 3A.

Next, the controller 50 controls the etalon peak of the liquid crystal etalon 14 so that the etalon peak of the liquid crystal etalon 14 corresponds to the etalon peak of the fixed etalon 13. In this case, the controller 50 controls the etalon peak of the liquid crystal etalon 14 so that the optical intensity of the transmitting light through the liquid crystal etalon 14 is increased. In addition, it is possible to control the etalon peak of the liquid crystal etalon 14 by controlling the voltage to be applied on the liquid crystal etalon 14 with use of the detected results of the optical detector elements 34 and 35. In this case, the optical intensity of the light resonating in the external cavity portion 10 is a value shown in point S in FIG. 3A.

Next, the controller 50 controls the optical intensity and the phase of the outputting light emitted from the laser device 100, by controlling the current to be provided to the semiconductor optical amplifier 11 based on the target data 200b. The wavelength and the optical intensity of the outputting light emitted from the laser device 100 are adjusted through the series of the operations mentioned above. The controller 50 controls the electrical signal to be provided to the phase shifter 12 so that the longitudinal mode of the external cavity portion 10 constantly corresponds to the etalon peak of the fixed etalon 13, after the longitudinal mode of the external cavity portion 10 corresponds to the etalon peak of the fixed etalon 13.

As mentioned above, the wavelength of the outputting light is controlled to be a desirable one, and a power efficiency is improved when the optical intensity of the outputting light is controlled to be a desirable one, in the laser device 100 in accordance with the embodiment.

The etalon peak of the fixed etalon 13 and the longitudinal mode of the external cavity portion 10 may be positioned at longer wavelength side compared to the etalon peak of the liquid crystal etalon 14 in a range where the etalon peak bandwidth of the liquid crystal etalon 14, the etalon peak bandwidth of the fixed etalon 13 and the longitudinal mode of the external cavity portion 10 are overlapped, although the etalon peak of the fixed etalon 13 and the longitudinal mode of the external cavity portion 10 are positioned at shorter wavelength side compared to the etalon peak of the liquid crystal etalon 14 in the embodiment.

The effect of the present invention is also obtained when the phase shifter 12 is controlled so that the longitudinal mode of the external cavity portion 10 shifts toward the etalon peak of the fixed etalon 13, although the phase shifter 12 is controlled so that the longitudinal mode of the external cavity portion 10 corresponds to the etalon peak of the fixed etalon 13 in the embodiment. In similarly, the effect of the present invention is obtained when the liquid crystal etalon 14 is controlled so that the etalon peak of the liquid crystal etalon 14 shifts toward the etalon peak of the fixed etalon 13, although the etalon peak of the liquid crystal etalon 14 is controlled so as to correspond to that of the fixed etalon 13.

Next, a description will be give of a method of tuning a wavelength. The controller 50 controls the semiconductor optical amplifier 11, the phase shifter 12 and the liquid crystal etalon 14, as shown in FIG. 3A through FIG. 3C. Next, the controller 50 controls the shutter 22 so that light outputting from the external cavity portion 10 is stopped. Even in a case, a light is resonating in the external cavity portion 10 constantly.

Next, the controller 50 controls the voltage to be applied on the liquid crystal etalon 14, the electrical signal to be provided to the phase shifter 12 and the electrical signal to be provided to the semiconductor optical amplifier 11 so that the channel is changed to another one of the initial data 200a of the control data 200. Therefore, the etalon peak of the liquid crystal etalon 14 and the longitudinal mode of the external cavity portion 10 are overlapped with another etalon peak of the fixed etalon 13. Next, the controller 50 controls the semiconductor optical amplifier 11, the phase shifter 12 and the liquid crystal etalon 14 with the control method of the laser device described in FIG. 3A through FIG. 3C.

As mentioned above, it is possible to stop outputting an unstable light when a wavelength, an output power, a phase and so on of the laser device 100 are adjusted. And the wavelength of the outputting light is effectively controlled so as to be a desirable value after the channel is changed.

In the embodiment, the liquid crystal etalon 14 corresponds to the wavelength selectable portion and the first etalon. The external cavity portion 10 corresponds to the cavity. The controller 50 corresponds to the control portion and control device of the laser device. The fixed etalon 13 corresponds to the etalon and the second etalon. The locking etalon 32 corresponds to the third etalon. The optical detector element 33 corresponds to the optical detection portion. The shutter 22 corresponds to the output control portion. The phase shifter 12 corresponds to the phase shift portion. The initial data 200a corresponds to the first control data and the second control data. The target data 200b corresponds to the first target value and the second target value. The etalon peak bandwidth corresponds to the transmission wavelength range.

Second Embodiment

Figure 4:
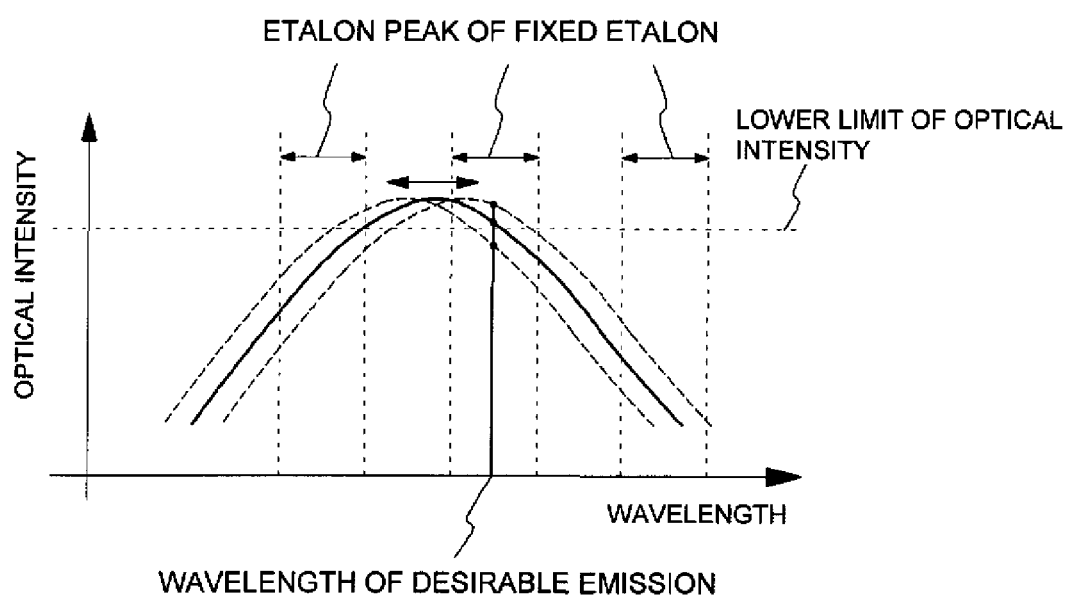
FIG. 4 illustrates the method of controlling the laser device.

Next, a description will be given of a laser device 100a in accordance with a second embodiment. The structure of the laser device 100a is as same as that of the laser device 100 in FIG. 1. A description will be given of a method of controlling the laser device 10a. FIG. 4 illustrates the method of controlling the laser device 10a. The vertical axis of FIG. 4 indicates an optical transmittance of the liquid crystal etalon 14. The horizontal axis of FIG. 4 indicates a wavelength.

A solid line of FIG. 4 indicates an etalon peak bandwidth of the liquid crystal etalon 14 based on the initial data 200*a*. In the embodiment, the desirable longitudinal mode of the external cavity portion 10 is set to be positioned at longer wavelength side compared to the etalon peak of the liquid crystal etalon 14. The etalon peak bandwidth of the liquid crystal etalon 14 includes more than one etalon peak of the fixed etalon 13.

In this case, a light of peak, which is one of the overlapped peaks of the etalon peak bandwidth of the liquid crystal etalon 14 and the etalon peak of the fixed etalon 13 and is above the lower limit of allowed value of the outputting light intensity, is output to outside of the laser device 100*a*. A light of another peak besides the overlapped peaks mentioned above is possibly emitted from the laser device 100*a*. And so, the controller 50 operates a following control in the embodiment.

The controller 50 controls the voltage to be applied on the liquid crystal etalon 14, the electrical signal to be provided to the phase shifter 12 and the electrical signal to be provided to the semiconductor optical amplifier 11 with use of the initial data 200*a* of the control data 200. In the embodiment, the etalon peak of the fixed etalon 13 and the longitudinal mode of the external cavity portion 10 are positioned at the etalon peak of the liquid crystal etalon 14 or at longer wavelength side compared to the etalon peak of the liquid crystal etalon 14 in the wavelength range where the etalon peak bandwidth of the liquid crystal etalon 14, the etalon peak bandwidth of the fixed etalon 13 and the longitudinal mode of the external cavity portion 10 are overlapped.

In this case, the optical intensity of the overlapped peak at longer wavelength side mentioned above is reduced, because the optical transmittance of the liquid crystal etalon 14 at longer wavelength side is reduced. Therefore, it is suppressed that a light of the overlapped peak at longer wavelength side is output to outside. It continues that a desirable wavelength light is output, because the optical intensity at a desirable wavelength peak is reduced in a range above the lower limit of the allowed value of the outputting light intensity.

On the other hand, the optical transmittance of the liquid crystal etalon 14 at shorter wavelength side is increased, when the etalon peak of the liquid crystal etalon 14 shifts toward shorter wavelength side. However, it is suppressed that the optical intensity of the overlapped peak at shorter wavelength side mentioned above is increased, because the gain of the semiconductor optical amplifier 11 is reduced in a range at shorter wavelength side compared to the lasing wavelength.

As mentioned above, it is suppressed that a light having more than one peak wavelength is output to outside when the etalon peak of the liquid crystal etalon 14 is shifted toward shorter wavelength side, even in a case where the etalon peak bandwidth of the liquid crystal etalon 14 includes more than one etalon peak of the fixed etalon 13.

Next, the controller 50 controls the longitudinal mode of the external cavity portion 10 so that the longitudinal mode of the external cavity portion 10 corresponds to the etalon peak of the fixed etalon 13, as well as the controlling method shown in FIG. 3A through FIG. 3C. In this case, the longitudinal mode of the external cavity portion 10 is controlled so that the optical intensity of the transmitting light through the fixed etalon 13 is increased. It is possible to control the longitudinal mode of the external cavity portion 10 by controlling the electrical signal to be provided to the phase shifter 12 with use of the detected results of the optical detector elements 33 and 34.

Next, the controller 50 controls the etalon peak of the liquid crystal etalon 14 in a range where the etalon peak of the liquid crystal etalon 14 is at shorter wavelength side compared to the lasing wavelength of the external cavity portion 10. In this case, the optical intensity of the transmitting light through the liquid crystal etalon 14 is increased, when the liquid crystal etalon 14 is controlled so that the etalon peak of the liquid crystal etalon 14 shifted toward longer wavelength side. On the other hand, the lasing of the external cavity portion 10 is maintained, when the liquid crystal etalon 14 is controlled so that the etalon peak of the liquid crystal etalon 14 is shifted toward shorter wavelength side.

Next, the controller 50 controls the optical intensity of the outputting light from the laser device 100*a*, by controlling the electrical signal to be provided to the semiconductor optical amplifier 11. With the series of operations mentioned above, the wavelength and the optical intensity of the outputting light from the laser device 100*a* is controlled. The controller 50 controls the electrical signal to be provided to the phase shifter 12 so that the longitudinal mode of the external cavity portion 10 constantly corresponds to the etalon peak of the fixed etalon 13, after the longitudinal mode of the external cavity portion 10 corresponds to the etalon peak of the fixed etalon 13.

As mentioned above, the wavelength of the outputting light is controlled to be a desirable one and the optical intensity of the outputting light is controlled to be a desirable one, when the laser device 100*a* in accordance with the embodiment is used. It is restrained that a light having more than one wavelength is output to outside.

The effect of the present invention is obtained when the phase shifter 12 is controlled so that the longitudinal mode of the external cavity portion 10 is shifted toward the etalon peak of the fixed etalon 13, although the phase shifter 12 is controlled so that the longitudinal mode of the external cavity portion 10 corresponds to the etalon peak of the fixed etalon 13 in the embodiment.

In the embodiment, it is possible to stop outputting an unstable light when a wavelength, an output power, a phase and so on of the laser device 100*a* are adjusted, with the same method of tuning a wavelength in accordance with the first embodiment. And the wavelength of the outputting light is effectively controlled so as to be a desirable value after the channel is changed.

The phase shifter 12 and the fixed etalon 13 may not be necessary, although the laser devices 100 and 100*a* has the phase shifter 12 and the fixed etalon 13 in order to improve the wavelength selection accuracy of the outputting light. For example, the effect of the present invention is obtained when the wavelength of the outputting light is changed with the liquid crystal etalon 14.

What is claimed is:

1. A laser device comprising:
    a cavity that has an optical amplifier, a first etalon having a tunable transmission wavelength range, a second etalon provided between the first etalon and the optical amplifier, and mirrors,
    the second etalon having a plurality of transmission wavelength ranges at a given interval in the transmission wavelength range of the first etalon,
    the second etalon being a fixed etalon; and
    a control portion controlling the first etalon so that the transmission wavelength range of the first etalon is changed to a given range,
    the control portion controlling the first etalon so that a lasing wavelength of the cavity is a wavelength positioned at longer wavelength side compared to a peak wavelength of the transmission wavelength range of the first etalon in the transmission wavelength range of the first etalon, wherein:
an optical intensity of an overlapped peak of the first etalon and the second etalon at the longer wavelength side is reduced because of an optical transmittance of the first etalon at the longer wavelength side being reduced; and
the optical intensity of the overlapped peak at shorter wavelength side is reduced because of a gain of the optical amplifier being reduced in a range at the shorter wavelength side compared to the lasing wavelength.

2. The laser device as claimed in claim 1, wherein the control portion controls the first etalon so that the cavity outputs a desirable lasing wavelength light and an optical intensity of the desirable lasing wavelength light is above a determined lower limit of the optical intensity.

3. The laser device as claimed in claim 2, wherein the first etalon has a changeable refractive-index against an incoming light according to an electrical signal provided thereto.

4. The laser device as claimed in claim 2 further comprising:
a third etalon having more than one transmission wavelength range at a given interval; and
an optical detection portion detecting optical intensity of a light passing through the third etalon,
wherein:
a light emitted from the cavity is fed into the third etalon; and
the control portion controls the wavelength selectable portion based on a detected result of the optical detection portion so that the cavity outputs a light of the desirable wavelength.

* * * * *